United States Patent [19]

Libby

[11] 3,783,411

[45] Jan. 1, 1974

[54] CONTINUOUSLY VARIABLE OSCILLATOR AND FREQUENCY MODULATOR

[76] Inventor: Ross C. Libby, 236 W. Main St., West Jefferson, Ohio 43162

[22] Filed: Oct. 30, 1972

[21] Appl. No.: 301,745

[52] U.S. Cl. ............ 332/9 R, 330/109, 331/177 R, 333/70 A

[51] Int. Cl. ....... H03b 3/04, H03b 5/20, H03k 7/10

[58] Field of Search ...................... 332/9; 333/70 A, 333/70 R, 70 CR; 331/34, 36, 8, 177, 172

[56] References Cited

UNITED STATES PATENTS 3,701,059 10/1972 Nyswander et al. ............. 333/70 A

*Primary Examiner*—Rudolph V. Rolinec
*Assistant Examiner*—Marvin Nussbaum
*Attorney*—Anthony D. Cennamo et al.

[57] ABSTRACT

A method and circuits are disclosed for permitting a pair of discrete circuit elements to operate as a continuously variable circuit element. The pair of elements, preferably resistances, are alternatively, periodically switched into connection and disconnection in a circuit at a rate substantially greater than the operative frequency of the circuit. The effective value of the switched elements depends upon their relative connection time. A continuously variable filter comprises an active filter in which the frequency determining resistance element is such a switched discrete pair of resistances. The addition of a regenerative feedback loop to such a filter provides a continuously variable oscillator. The further addition of a pulse width modulator to the oscillator, for alternatively switching the discrete resistances in response to an input signal provides a frequency modulator.

13 Claims, 7 Drawing Figures

CONTINUOUSLY VARIABLE OSCILLATOR AND FREQUENCY MODULATOR

BACKGROUND

This invention relates generally to continuously variable circuit elements and methods for obtaining same and particularly relates to continuously variable circuits for use in communicatioms.

Circuits such as band pass filters, oscillators, and modulators desirably have variable characteristics. Band pass filters for example, are desirably made variable from one pass band to another. Active band pass filters exhibit well-known desirable characteristics. For example, an active band pass filter constructed from an operational amplifier with suitable feedback exhibits good stability, simplicity, use of few components and ease of trimming. There is a need, therefore, for a voltage controlled, active, op-amp, band pass filter which has a continuously variable pass band over a desired frequency range. Such a filter could for example, be used in tuning.

Another advantage of such active band pass filters is that they utilize resistances as frequency determining elements and thereby eliminate the energy storage problems associated with reactive circuit elements. Although capacitors do affect the frequency, they are fixed value and not switched. This leads to the advantage that circuits using primarily resistive frequency-determining elements are not significantly dependent on semiconductor device characteristics for their operation. Therefore a minimum of adjustment is needed after manufacture.

It would be advantageous to incorporate in a circuit the advantages of such active networks with resistive frequency determinitive networks while providing a continuously variable characteristic.

Oscillators and frequency modulators desirably exhibit a continuously variable relationship between input signal amplitude and the output signal frequency. It would therefore be desirable to attain the above advantages in a continuously variable oscillator or modulator.

There is therefore a need for a method for providing an effectively continuously variable circuit element from highly stable, close tolerance, and highly reliable discrete circuit elements.

SUMMARY OF THE INVENTION

The invention has a continuously variable oscillator which comprises an active filter of the type having an amplifying device and an associated frequency determining feedback network wherein the frequency response is a function of a resistive element of the frequency determining network. The resistive frequency determining element comprises a pair of discrete resistive elements having one of said resistive elements series connected to a first electronic switch. The second resistive element is at least at times parallel connected to the first resistor and first switch. Preferably, the second resistor is series connected to a second electronic switch. The first resistor and first switch are parallel connected to the second resistor and second switch and the resistors have different resistances. A switching means is connected to the electronic switch or switches for alternatively connecting and disconnecting the resistors in the network at a rate substantially exceeding the oscillator frequency. A regenerative feedback loop is provided from the output to the input of the filter, this feedback loop having sufficient gain and phase shift to induce oscillation. The oscillator output frequency is function of the relative time each resistor is effectively connected in the circuit.

The oscillator may be operated as a frequency modulator by switching the resistances with a pulse width modulator having its output connected to the electronic switches and having the modulating signal applied at its input.

It is therefore an object of the invention to provide an improved method for obtaining a continuously variable effective circuit element.

Another object of the invention is to provide a stable, simple, and uniformly manufacturable communications circuit.

Figure 2:
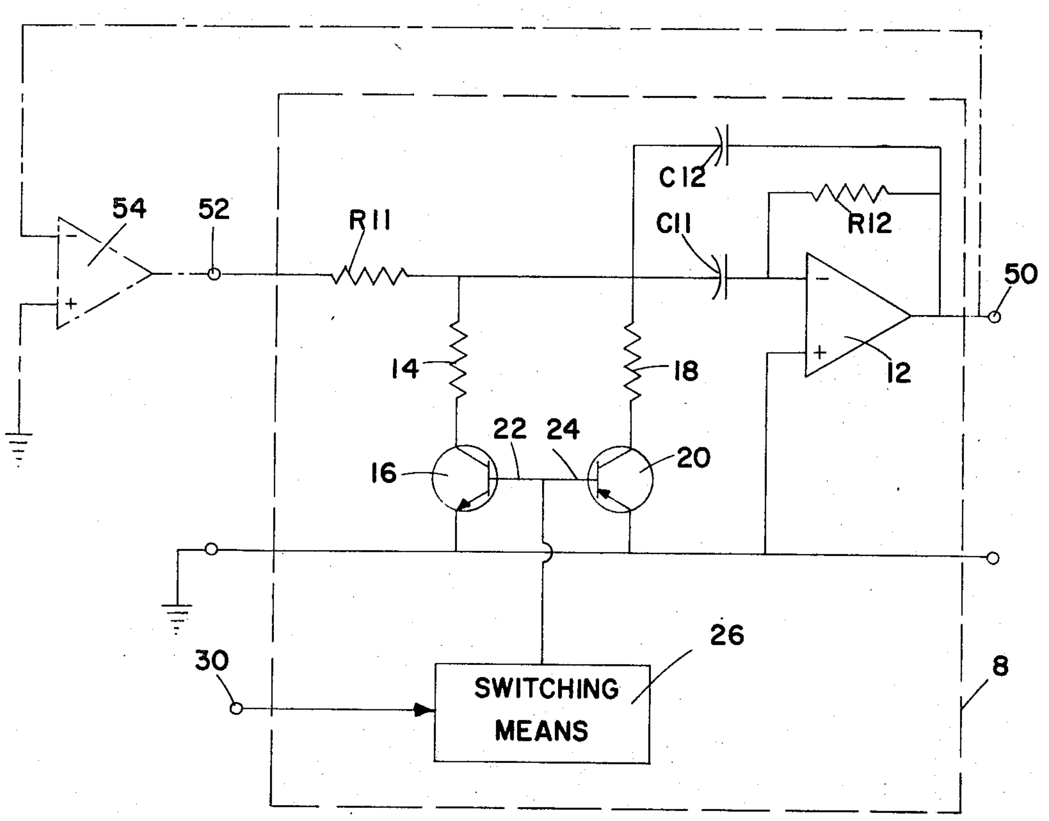
FIG. 2 is a schematic diagram of a filter and oscillator circuit embodying the invention.

Further objects and features of the invention will be apparent from the following specification and claims when considered in connection with the accompanying drawings illustrating several embodiments of the invention.

In describing the embodiments of the invention illustrated in the drawings, specific terminology will be resorted to for the sake of clarity. However, it is not intended to be limited to the specific terms so selected, and it is to be understood that each specific term includes all technical equivalents which operate in a similar manner to accomplish a similar purpose. For example, the term "connection" is often used and is not limited to direct connection but includes a connection through other circuit elements whenever resultant operation of the circuit is equivalent.

DETAILED DESCRIPTION

Figure 1:
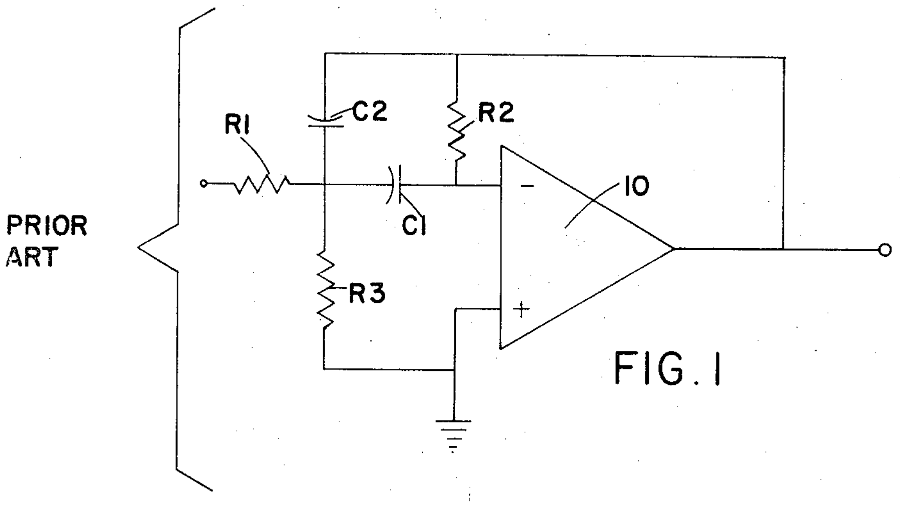
FIG. 1 is a schematic diagram of a prior art active filter.

FIG. 1 illustrates an active, band pass filter utilizing a high gain operational amplifier 10. The filter frequency response depends upon a feedback network including resistors $R_1$, $R_2$ and $R_3$ and capacitances $C_1$ and $C_2$ connected as illustrated in FIG. 1. The operational characteristics of this active band pass filter are determined by the following formulas:

$$C_1 = C_2 = C$$

$$R_1 = (2\pi BAC)^{-1}$$

$$R_2 = (\pi BC)^{-1}$$

$$2\pi CR_3 = (2F^2/B - BA)^{-1}$$

where $B$ is bandwidth and $F$ is the center frequency.

$$F = (1/2\pi C)\sqrt{(R_1+R_3)/(R_1R_2R_3)}$$

If $R_1 >> R_3$ then $F \approx 1/(2\pi C\sqrt{R_2R_3})$

From the above equations, it is apparent that the center frequency $F$ of the pass band, that is, the operative frequency of the filter is proportional to the square root of the resistance $R_3$. Therefore, the operative frequency of the circuit is a function of the resistive element $R_3$.

FILTER

FIG. 2 illustrates a filter in which the circuit of FIG. 1 has been modified according to the present invention. The circuit of FIG. 2 has an active amplifying device 12 which is a high gain operational amplifier. Additionally, it has a frequency determining feedback network including resistors $R_{11}$ and $R_{12}$ corresponding respectively to resistors $R_1$ and $R_2$ of FIG. 1. It also has capacitances $C_{11}$ and $C_{12}$ corresponding to capacitors $C_1$ and $C_2$ of FIG. 1.

However, the resistances $R_3$ of FIG. 1 has been replaced by an effectively variable resistive element comprising a first, series connected first discrete resistor 14 and first electronic switch 16 and a second series connected second discrete resistor 18 and second electronic switch 20. The preferred electronic switches 16 and 20 are complementary bipolar transistors connected as illustrated in FIG. 1. The first series connected resistor 14 and switch 16 are connected parallel to the second series connected resistor 18 and switch 20.

The switches 16 and 20 have their control inputs, such as their bases 22 and 24, connected to a switching means 26. The switching means 26 connected to the switches 16 and 20 is for alternatively, periodically connecting and disconnecting the resistances 14 and 18 into the frequency determining feedback network. By alternatively connecting and disconnecting, it is meant that during a first time interval the switch 16 is on to connect the resistance 14 in the circuit and simultaneously the switch 20 is off to disconnect resistance 18 from the circuit. During the subsequent instant of time, the conditions are reversed and resistance 18 is connected in the circuit while the resistance 14 is disconnected from the circuit. Thus, in the case of a pair of alternatively switched resistances, when one is on, the other is off. In this manner, the effective resistance of the circuitry substituted for $R_3$ in FIG. 1 is alternatively switched between two resistive values.

It should therefore be apparent that, alternatively, a single series resistance and switch could be connected in parallel with a resistance which is always in connection in the circuit. In such an equivalent circuit, the resistance of the effective network, which would be substituted for the resistance $R_3$ of FIG. 1, would be switched between the value of the unswitched resistance alone and the value of the parallel combination of the unswitched resistance and the switched resistance. Preferably, however, the circuit utilizes a pair of alternatively switched resistances to switch the resistances connected in place of $R_3$ in FIG. 1 between the values represented by the two discrete resistances.

When complementary transistors are used as illustrated in FIG. 2, their control inputs may be tied together and connected to a single output of the switching means 26. The switching means 26 switches with a rectangular waveform between opposite polarities to alternatively bring the transistor 16 and 20 switches into conduction and non-conduction, by alternatively forward biasing, their base to emitter junctions.

It may be noted that the current through switches 16 and 20 will be minimal. The function of the switches 16 and 20 is solely to connect their associated resistances to ground. Consequently, so long as the base-emitter current of each transistor exceeds the maximum a.c. current peak through the resistances 14 and 18 they can effectively perform this function in spite of the fact that the indicated direction of conventional current flow is in opposite directions in these two transistors.

The switching means 26 alternatively connects and disconnects the resistances 14 and 18 in the feedback network in a periodic manner. During the first portion of each cycle, one resistor will be connected while the other is disconnected. During the later portion of each cycle, the other resistor will be connected while the first will be disconnected. The switching rate must substantially exceed the operative frequency of the filter. For example, a filter was constructed having a center frequency between 1 KHz and 2 KHz and the resistors were switched at a 500 KHz rate.

I have found that when the resistances are switched as described above, the center frequency and other characteristics of the filter correspond neither to the value which would be obtained by the discrete resistance 14 alone nor that which would be obtained by the discrete resistance 18 alone. Instead, I have found that the operative frequency and other characteristics are effectively what they would be if an intermediate value of resistance were permanently connected in place of the two series resistances and switched 14, 16, 18 and 20. The particular operative frequency of the filter is a function of the relative time that each resistor is connected in the circuit.

Advantageously, the switching means 26 has an input 30 by which the on time of resistance 14 is continuously variable from 0% to 100% while the on time of the resistance 18 is continuously variable simultaneously from 100 to 0 percent of each switching means cycle. The filter is then continuously variable from the operative center frequency to be expected from the resistance 14 connected permanently alone to the operative center frequency to be expected from the resistance 18 connected permanently alone.

For example, the switching means may be adjusted by its input 30 such that the resistance 14 is connected in the circuit for the first 10 percent of each switching cycle while the resistance 18 is connected in the circuit for the latter 90 percent of each switching cycle. These relative on connection times would provide an operative filter frequency near but spaced from that expected if the resistance 18 were permanently connected alone in the circuit. If the switching cycle is varied, for example, such that the resistance 14 is on for 40 percent of each switching cycle while the resistance 18 is on for the other 60 percent of the switching cycle then a more intermediate operative frequency would be expected.

In the circuit illustrated in FIG. 2, the switching means 26 may, for example, be a pulse width modulator having a rectangular output which switches between opposite polarities. In a linear pulse width modulator, the output pulse width is directly proportional to the amplitude of an input signal. Consequently, if a continuously variable dc signal is applied at the input 30 of such a pulse width modulator switching means, the relative connection times for the resistances 14 and 18 will be directly proportional to the input dc signal. Of course, since the equations stated above demonstrate that the operative frequency of the filter is inversely proportional to the square root of the effective resistance, such as the resistances $R_3$ in FIG. 1, there will therefore be a non-linear relationship between the input voltage at the input terminal 30 and the operative frequency of the filter illustrated in FIG. 2.

Figure 4:
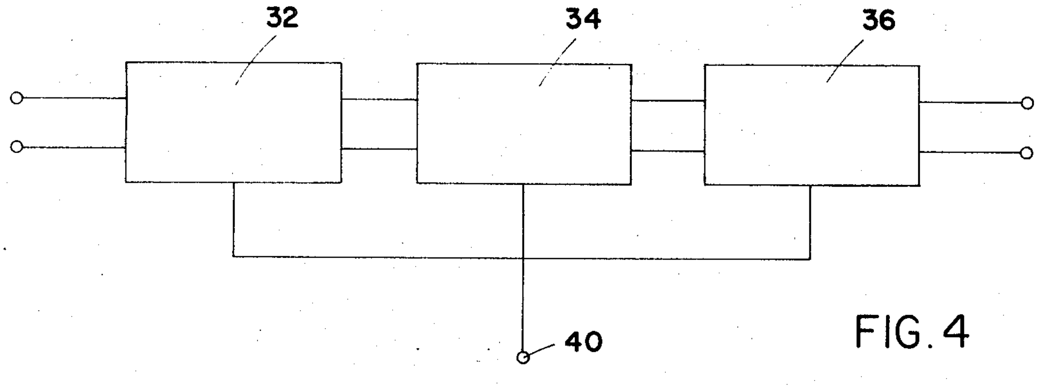
FIG. 4 is a block diagram illustrating a continuously variable band pass filter embodying the invention.
Figure 4A:
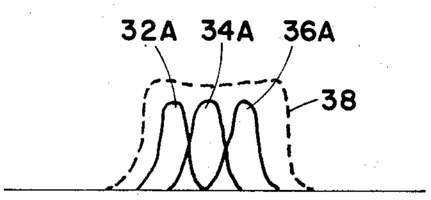
FIG. 4A is a graphical illustration of the operation of the embodiment illustrated in FIG. 4.

FIG. 4 illustrates a band pass filter having a continuously variable pass band. It comprises a plurality of filter stages identical to the filter stage 8, illustrated in FIG. 2 as defined by the phantom line in FIG. 2. For example, it may have three filter stages 32, 34 and 36 connected in series. Each filter is identical except that each is operative at a different center frequency as illustrated in FIG. 4A. Thus each filter has a transfer characteristic illustrated by its corresponding curve 32A, 34A and 36A in FIG. 4A. Accumulatively, however, they form a pass band such as illustrated at 38 in FIG. 4A. Variations in the input voltage at the input terminal 40 will continuously vary the relative connection times of the resistance pairs in each of the filters 32, 34 and 36 and thereby will simultaneously shift the three center frequencies continuously between boundary limits. The boundary limits at the upper end of this range will be determined by the operative frequency of each filter when its lower switched resistance is connected 100% of the time and the lower limit of this frequency range will be determined by the operative frequency of each filter when its larger switched resistance is connected 100 percent of the time.

METHOD

From the above discussion it can be seen that I have taken a pair of discrete elements, such as resistances 14 and 18 and operated them as a single impedance element which is effectively continuously variable from the value of one of the discrete elements to the value of the other discrete element. This has been done by alternatively, periodically switching the discrete elements in connection with the same terminals in the circuit at a rate substantially greater than the operative frequency of the circuit. The particular effective value of such a continuously variable impedance element is dependent upon the relative connection or on times of each discrete impedance element.

By using a pulse width modulator, the relative connection and disconnection time intervals may be continuously varied as a function of an input voltage. Preferably, the elements are switched by a substantially rectangular periodic signal. Also, preferably, the switching rate is maintained constant and only the relative connection time intervals are varied to vary the effective impedance of the circuit. Of course, a single resistance could be switched as described above.

OSCILLATOR

The filter 8 illustrated in FIG. 2 can be the adapted to form an oscillator circuit. A regenerative feedback loop from the output 50 of the filter to the input 52 of the filter is added to cause such oscillation. The filter 8 together with the inverter of op-amp 54 provides the necessary closed loop phase shift of 360°.

Because the operative frequency of this filter 8 is continuously variable over the above described range by varying the input voltage at the switching means input 30, when regenerative feedback is added to the filter, an oscillator is provided which is continuously variable over the identical range. Thus, the circuit will oscillate at whatever center frequency the filter is adjusted to.

FREQUENCY MODULATOR

Figure 3:
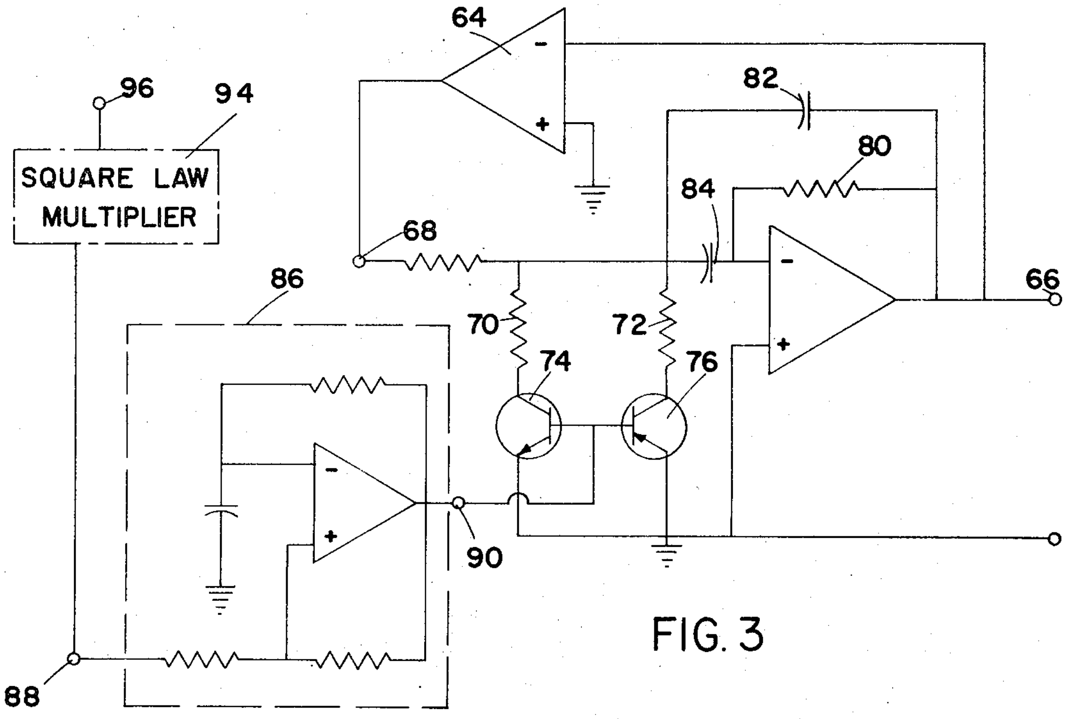
FIG. 3 is a schematic diagram of a modulator circuit embodying the invention.

FIG. 3 illustrates a frequency modulator constructed according to the present invention. It comprises an oscillator as illustrated in FIG. 2 including the inverting op amp 64 for providing the requisite regenerative feedback loop from its output 66 to its input 68. Its frequency response is determined, like the circuit in FIG. 2 by the feedback network including switched resistances 70 and 72 which are alternatively switched by transistors 74 and 76 and the resistance 80 and capacitors 82 and 84. The switching means is a pulse width modulator 86 having an input 88. Since pulse width modulators are conventional and many types are known, the operation of this pulse width modulator is not further described. It is sufficient to say that the pulse width of its rectangular output pulses at its output terminal 90 is directly proportional to the signal amplitude at its input terminal 88. Output pulses of a positive polarity at terminal 90 of a negative polarity switch the transistor switch 76 on and the transistor switch 74 off.

The relative connection times of the resistances 70 and 72 are a directly proportional function of the modulating signal amplitude at the input 88 of the pulse width modulator 86. Consequently the oscillator frequency is a function of the input signal amplitude and therefore the circuit of FIG. 3 is a frequency modulator in which the output frequency at the output terminal 66 is a function of the modulating input signal at the input terminal 88. However, because of the relationships described in the equations above, the output frequency of the modulator will be inversely proportional to the square root of the input signal amplitude at the input terminal 88.

Nonetheless, a linear relationship may be created if a square law multiplier 94 illustrated in phantom in FIG. 3 is interposed between a modulating signal input 96 and the pulse width modulator input 88. Such a square law multiplier, well known in the art, will provide a linear relationship between the signal amplutude at its input 96 and the frequency at the output 66 of the frequency modulator in FIG. 3.

Figure 5A:
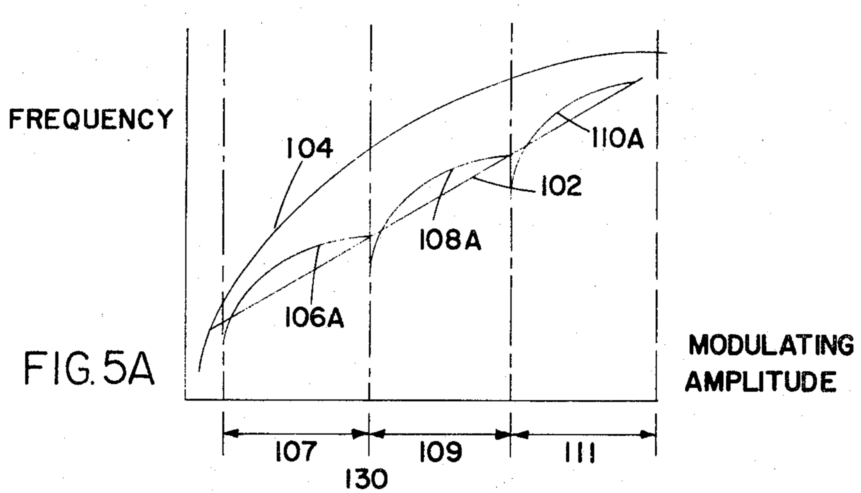
FIG. 5A is a graphical illustration of the characteristics of the embodiment of FIG. 5.

FIG. 3 illustrates the use of a square law multiplier to attain a linear relationship between the modulating input signal and the output frequency. FIG. 5A illustrates at curve 102 an ideal linear relationship between the modulating signal amplitude and output frequency of a frequency modulator. However, curve 104 illustrates the relationship expected from the circuit in FIG. 3 between the pulse width modulator input 88 and the modulator output 66. This curve 104 represents the square law relationship between the input amplitude and the output frequency.

I have discovered that the linear curve 102 may be approximated by three or preferably more square law curves 106, 108 and 110 illustrated in FIG. 5A. Each of these three approximation curves corresponds to a different one of the switched pairs 106, 108 and 110 illustrated in FIG. 5.

Figure 5:
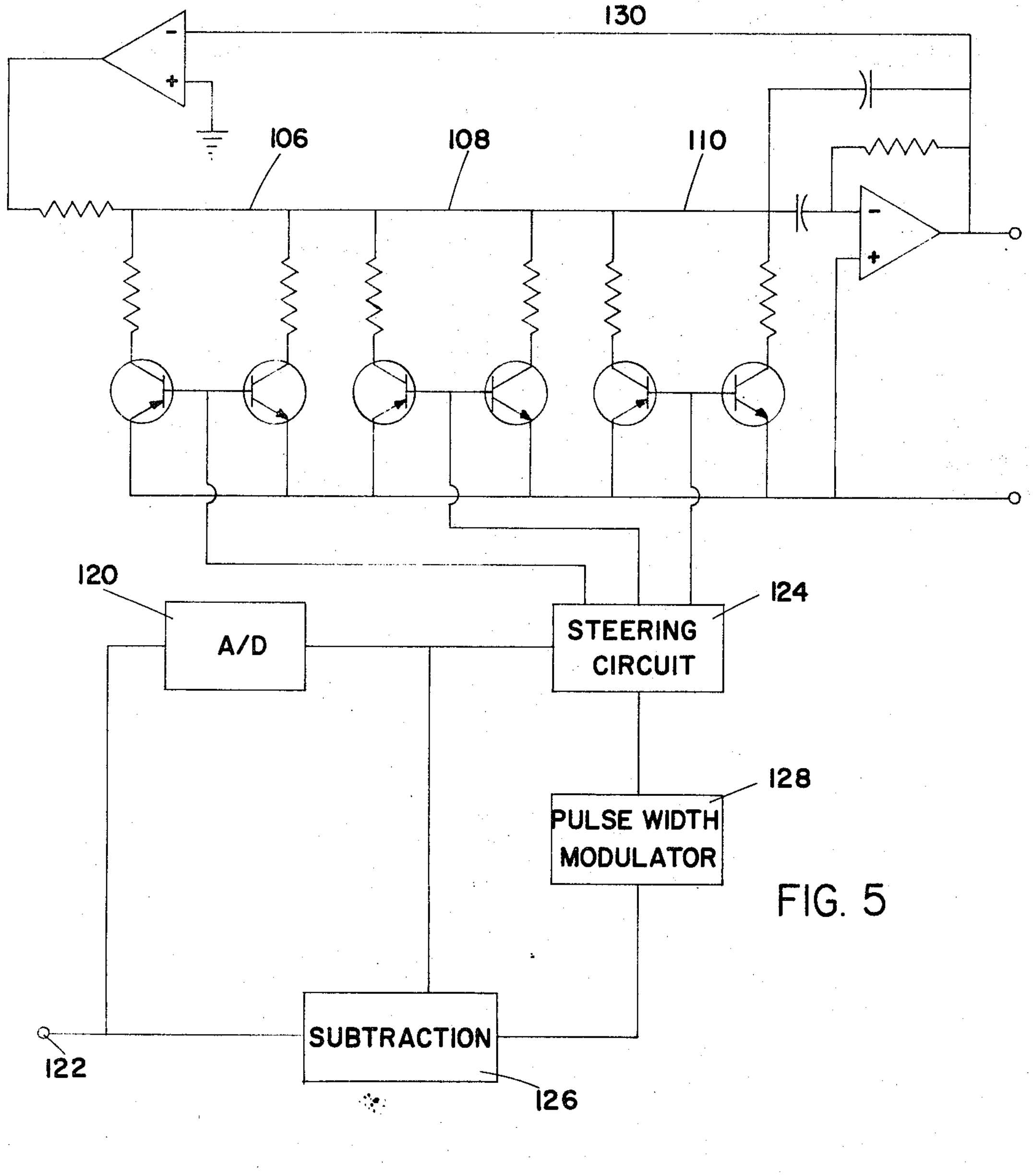
FIG. 5 is a block diagram of an alternative, approximately linear modulator embodying the invention.

The circuit in FIG. 5 is intended to utilize the frequency determining switched resistances 106 when the modulating input signal is in the amplutude range 107 in FIG. 5A. When the modulating signal amplitude is in the range 109, the switched resistance pairs 108 are switched to determine the modulator output frequency according to the approximation curve 108A. Similarly, when the modulating signal amplutude is in the range 111, approximation curve 110A is attained by alternatively switching the resistance pair 110.

FIG. 5 further illustrates circuitry for directing the output of the pulse width modulator to the suitable pair of switched resistances 106, 108 or 110. An analog/-digital converter 120 is connected to the modulating signal input 122 to convert the modulating analog signal to digital output form. For example, considering FIG. 5A, the output of the A/D converter 120 will represent a first state if the modulating amplitude is in the range 107, a second state if in the range 109, and a third state if in the range 111. The output of the A/D converter 120 is connected to a steering circuit 124 and to a subtracting circuit 126. The steering circuit directs the output of the pulse width modulator 128 to the proper switched pair in response to the output state of the A/D converter 120. It also holds the unswitched pairs in nonconduction, for example, by holding their bases at ground potential.

The pulse width modulator output must be continuously variable from a 0 percent of the cycle pulse width to a 100 percent of the cycle pulse width for each of three intervals illustrated in FIG. 5A. This may be accomplished by subtracting from the input modulating signal at the input 122 an amplitude equal to the lower end of the range 107, 109 or 111 in which the circuit is instantaneously operating. For example, if the instantaneous modulating amplitude lies in the range 109, then the subtraction circuit 126 will subtract an amplitude represented by the range boundary 130 in FIG. 5A from the total modulating signal amplitude. Consequently, the actual input amplitude to the pulse width modulator 128 will represent the excursion of the modulating signal into a particular range. Thus, within each range, the output of the pulse width modulator will be continuously variable from 0 pulse width to 100 percent of the cycle pulse width.

It is to be understood that while the detailed drawings and specific examples given describe preferred embodiments of the invention, they are for the purposes of illustration only that the apparatus of the invention is not limited to the details and conditions disclosed and that various changes may be made therein without departing from the spirit of the invention which is defined by the following claims.

What is claimed is:

1. A continuously variable oscillator comprising a continuously variable active filter of the type having an amplifying device and an associated frequency determining feedback network, the frequency response of said active filter being a function of a resistive element of said network wherein the improvement comprises:

a. an effectively continuously variable resistive element comprising a pair of discrete resistors having a first electronic switch series connected to a first one of said discrete resistors and having the second resistor at least at times connected parallel to said series first resistor and first switch; and b. a switching means connected to control said electronic switch for alternately connecting and disconnecting said first resistor in said network at a rate substantially exceeding the operative frequency of said filter; and c. a regenerative feedback loop from the output to the input of said filter, said feedback loop having sufficient gain and phase shift to induce oscillations;

wherein the oscillator frequency is the operative frequency of said filter.

2. An oscillator according to claim 1 wherein a second electronic switch is interposed in series connection with said second resistance and is connected for control by said switching means and wherein said switching means alternatively, periodically connects and resistors in said network wherein the operative frequency of said oscillator is continuously, variable from the operative frequency determined by said first resistance alone to the operative frequency determined by said second resistance alone and is a function of the relative time each resistor is effectively connected in the circuit.

3. An oscillator according to claim 2 wherein said electronic switches comprise complementary transistors having their control inputs connected together and to the output of said switching means and wherein said switching means provides a rectangular output oscillating between opposite polarities.

4. An oscillator according to claim 3 wherein said switching means has a controlling input for selecting the relative time duration of each output polarity.

5. An oscillator according to claim 4 wherein said switching means comprises a pulse width modulator.

6. An oscillator according to claim 5 wherein said feedback loop includes an inverter.

7. A frequency modulator comprising:

a. an oscillator according to claim 1; and b. a pulse width modulator having its output connected to said electronic switches and having the modulating signal applied at its input.

8. A modulator according to claim 7 wherein a second electronic switch is interposed in series connection with said second resistance and is connected for control by said switching means and wherein said switching means alternatively periodically connect said resistors in said network wherein the operative frequency of said modulator is continuously variable from the operative frequency determined by said first resistance alone to the operative frequency determined said second resistance alone and is function of the relative time each resistor is effectively connected in the circuit.

9. A modulator according to claim 8 wherein said electronic switches comprise complementary transistors having their control inputs connected together and to the output of said switching means and wherein said switching means provides a rectangular output oscillating between opposite polarities.

10. A modulator according to claim 9 wherein said switching means comprises a pulse width modulator.

11. A modulator according to claim 10 wherein a square law multiplier is interposed between said modulating signal input and said pulse width modulator.

12. A modulator according to claim 8 wherein said frequency determining feedback network includes a plurality of said continuously variable resistive elements and wherein said switching means includes means for selecting one of said continuously variable resistive elements for alternatively being connected and disconnected in said network.

13. A modulator according to claim 12 wherein said selecting means comprises:

a. a steering circuit interposed between said pulse width modulator and said electronic switches for applying the output of said pulse width modulator to one of said continuously variable resistive elements;

b. an analog to digital converter having its input connected to receive the modulating signal for providing discrete digital output states corresponding to selected ranges of said modulating signal and its output connected to control said steering circuit for controlling the selection of said resistive elements; and c. a subtraction circuit connected for control by the output of said analog to digital converter, and having its input connected to said modulating signal and its output connected to the input of said pulse width modulator for subtracting from said modulating signal an amplitude equal to the lower boundary of whichever of said selected ranges the modulating signal is instantaneously within.

* * * * *